(12) United States Patent
Kim et al.

(10) Patent No.: US 10,404,240 B2
(45) Date of Patent: Sep. 3, 2019

(54) SEMICONDUCTOR DEVICE COMPRISING LOW POWER RETENTION FLIP-FLOP

(71) Applicant: Samsung Electronics Co., Ltd., Suwon-si, Gyeonggi-do (KR)

(72) Inventors: Jong Woo Kim, Osan-si (KR); Min Su Kim, Hwaseong-si (KR); Ah Reum Kim, Daegu (KR); Chung Hee Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 15/399,146

(22) Filed: Jan. 5, 2017

(65) Prior Publication Data

US 2017/0222633 A1 Aug. 3, 2017

(30) Foreign Application Priority Data

Jan. 28, 2016 (KR) .................. 10-2016-0010986
Feb. 2, 2016 (KR) .................. 10-2016-0012815

(51) Int. Cl.
*H03K 3/356* (2006.01)
*H03K 3/3562* (2006.01)
*H03K 3/037* (2006.01)

(52) U.S. Cl.
CPC ....... *H03K 3/35625* (2013.01); *H03K 3/0375* (2013.01)

(58) Field of Classification Search
CPC ............... H03K 3/356225; H03K 3/01372
USPC .................. 327/538, 543; 326/33, 95
See application file for complete search history.

(56) References Cited

U.S. PATENT DOCUMENTS

| 7,183,825 B2 | 2/2007 | Padhye et al. |
| 7,301,381 B2 | 11/2007 | Rhee et al. |
| 7,652,513 B2 | 1/2010 | Rao et al. |
| 7,772,906 B2 | 8/2010 | Naffziger |

(Continued)

FOREIGN PATENT DOCUMENTS

| JP | 2004-064557 A | 2/2004 |
| KR | 2009-0040519 A | 4/2009 |
| KR | 1165730 | 7/2011 |

OTHER PUBLICATIONS

Final Office Action dated Aug. 16, 2018 for corresponding U.S. Appl. No. 15/417,339.

(Continued)

*Primary Examiner* — Dinh T Le
(74) *Attorney, Agent, or Firm* — Harness, Dickey & Pierce, P.L.C.

(57) ABSTRACT

Provided is a semiconductor device including low power retention flip-flop. The semiconductor device includes a first line to which a global power supply voltage is applied, a second line to which a local power supply voltage is applied, the second line being separated from the first line, a first operating circuit connected to the second line to use the local power supply voltage, a first power gating circuit determining whether the local power supply voltage is applied to the first operating circuit and a first retention flip-flop connected to the first line and the second line, wherein the first retention flip-flop comprises a first circuit including a master latch, a second circuit including a slave latch, and a first tri-state inverter connected between the master latch and the slave latch.

20 Claims, 11 Drawing Sheets

(56) References Cited

U.S. PATENT DOCUMENTS

| | | | |
|---|---|---|---|
| 7,948,263 B2* | 5/2011 | Kim | H03K 19/0016 |
| | | | 326/112 |
| 7,982,514 B2 | 7/2011 | Biyani | |
| 8,013,628 B2* | 9/2011 | Lee | H04B 15/02 |
| | | | 326/21 |
| 8,018,247 B2 | 9/2011 | Priel et al. | |
| 8,085,076 B2 | 12/2011 | Djaja et al. | |
| 8,355,293 B2* | 1/2013 | van Winkelhoff | G11C 11/413 |
| | | | 365/189.09 |
| 8,381,163 B2* | 2/2013 | Schreiber | H03K 3/0375 |
| | | | 716/101 |
| 8,451,039 B2 | 5/2013 | Myers et al. | |
| 8,854,077 B2 | 10/2014 | Hoberman et al. | |
| 8,994,431 B2 | 3/2015 | Chang | |
| 9,081,061 B1 | 7/2015 | Agarwal et al. | |
| 9,099,998 B2 | 8/2015 | Bartling et al. | |
| 9,473,113 B1 | 10/2016 | Pant et al. | |
| 9,542,994 B1 | 1/2017 | Prabhat et al. | |
| 2009/0066386 A1 | 3/2009 | Lee | |
| 2014/0075087 A1 | 3/2014 | Bartling et al. | |
| 2015/0200651 A1 | 7/2015 | Baratam | |

OTHER PUBLICATIONS

Non-Final Office Action dated Dec. 4, 2018 for corresponding U.S. Appl. No. 15/417,339.
Non-Final Office Action dated Apr. 3, 2018 in corresponding U.S. Appl. No. 15/417,339.
U.S. Appl. No. 15/417,339, filed Jan. 27, 2017.
Final Office Action dated Apr. 12, 2019 for corresponding U.S. Appl. No. 15/417,339.

* cited by examiner

SEMICONDUCTOR DEVICE COMPRISING LOW POWER RETENTION FLIP-FLOP

CROSS-REFERENCE TO RELATED APPLICATION

This application claims priority from Korean Patent Application Nos. 10-2016-0010986 filed on Jan. 28, 2016 and 10-2016-0012815 filed on Feb. 2, 2016 in the Korean Intellectual Property Office, and all the benefits accruing therefrom under 35 U.S.C. 119, the contents of which in its entirety are herein incorporated by reference.

BACKGROUND

1. Technical Field

Example embodiments of the present inventive concepts relate to a semiconductor device including a low power retention flip-flop.

2. Description of the Related Art

In order to design a low power semiconductor chip, a power gating technique may be used to reduce the leakage current by shutting off a power supply to blocks of a circuit that are not in use. In order to use such a power gating technique, data in a flip-flop may be moved to a different location when cutting off the power supply. To this end, a method of cutting off the power supply after storing data in a retention flip-flop for data retention has been used. Thus, research on the retention flip-flop has been actively conducted.

SUMMARY

Example embodiments of the present inventive concepts may relate to a semiconductor device comprising a low power retention flip-flop which may avoid an unnecessary transition by a clock signal after a retention signal is activated.

Example embodiments of the present inventive concepts may also relate a semiconductor device comprising a low power retention flip-flop capable of achieving miniaturization and reduction (or, alternatively, minimization) of the number of elements to reduce (or, alternatively, minimize) the leakage current.

According to an example embodiment of the present inventive concepts, there is provided a semiconductor device including a first line to which a global power supply voltage is applied, a second line to which a local power supply voltage is applied, the second line being separated from the first line, a first operating circuit connected to the second line to use the local power supply voltage, a first power gating circuit determining whether the local power supply voltage is applied to the first operating circuit, and a first retention flip-flop connected to the first line and the second line, wherein the first retention flip-flop comprises a first circuit including a master latch, a second circuit including a slave latch, and a first tri-state inverter connected between the master latch and the slave latch.

According to another example embodiment of the present inventive concepts, there is provided a semiconductor device including a first line to which a global power supply voltage is applied, a second line to which a local power supply voltage is applied, the second line being separated from the first line, a first circuit connected to the second line to store a data signal inputted using a clock signal and the local power supply voltage, a second circuit which stores the data signal by using the global power supply voltage and the clock signal if a signal level of a retention signal is a first level, and stores the data signal by using the global power supply voltage regardless of the clock signal if the signal level of the retention signal is a second level different from the first level, and a tri-state inverter which is controlled in accordance with the signal level of the retention signal to invert an output of the first circuit and transmit the inverted result to the second circuit.

However, example embodiments of the present inventive concepts are not restricted to those set forth herein. The above and other example embodiments of the present inventive concepts will become more apparent to one of ordinary skill in the art to which the present inventive concepts pertain by referencing the detailed description of some example embodiments of the present inventive concepts given below.

BRIEF DESCRIPTION OF THE DRAWINGS

The above and other aspects and features of example embodiments of the present inventive concepts will become more apparent by describing in detail some example embodiments thereof with reference to the attached drawings, in which.

DETAILED DESCRIPTION

Figure 1:
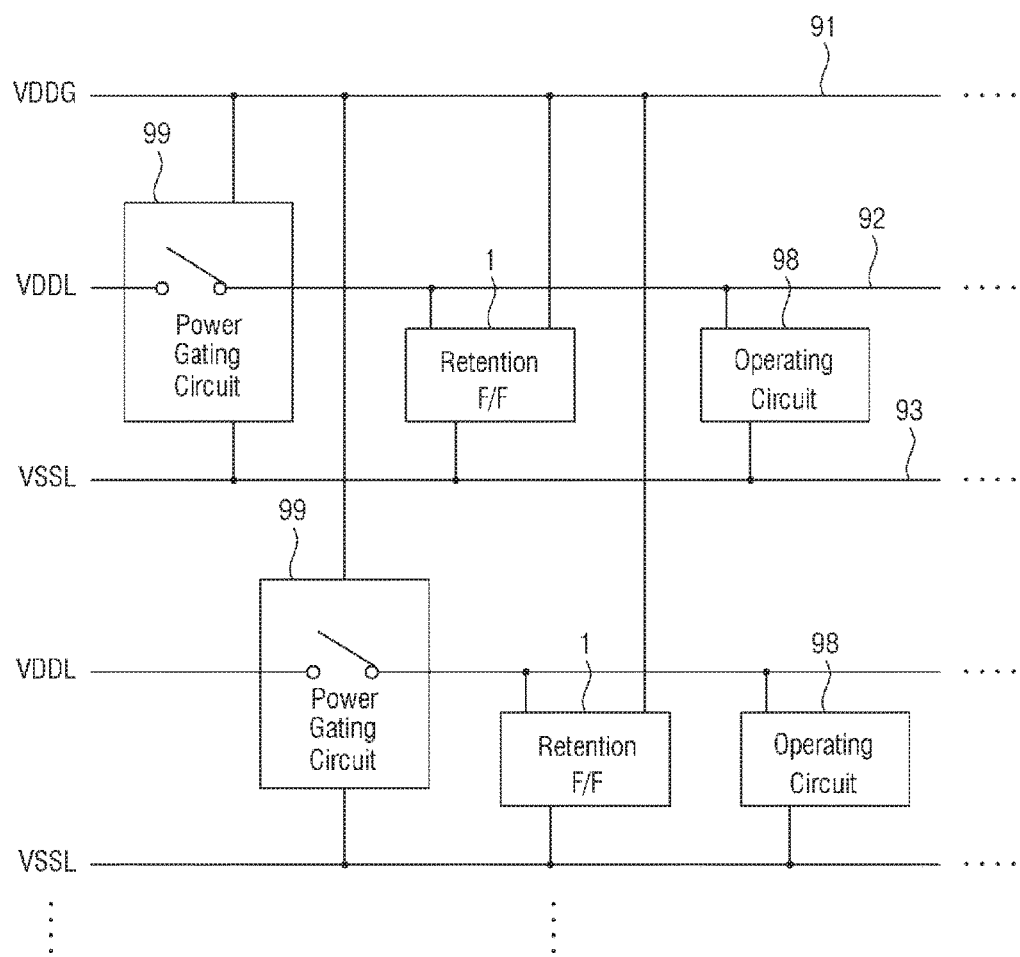
FIG. 1 is a conceptual block diagram of a semiconductor device according to example embodiments of the present inventive concepts.

Example embodiments will be described in detail with reference to the accompanying drawings. Example embodiments of inventive concepts, however, may be embodied in various different forms, and should not be construed as being limited only to the illustrated example embodiments. Rather, these example embodiments are provided as examples so that this disclosure will be thorough and complete, and will fully convey the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Advantages and features of the present disclosure and methods of accomplishing the same may be understood more readily by reference to the following detailed description of example embodiments and the accompanying drawings.

FIG. 1 is a conceptual block diagram of a semiconductor device according to the example embodiments of the present inventive concepts.

Referring to FIG. 1, a semiconductor device may include a retention flip-flop 1, an operating circuit 98 and a power gating circuit 99.

The power gating circuit 99 may be connected to a global power supply voltage line 91 and a ground line 93. The power gating circuit 99 may determine whether a local power supply voltage VDDL is applied to the operating circuit 98.

Specifically, the power gating circuit 99 may determine whether the local power supply voltage VDDL is applied to the operating circuit 98 and switch on/off blocking of the local power supply voltage VDDL via a local power supply voltage line 92 using a global power supply voltage VDDG.

When the power gating circuit 99 applies the local power supply voltage VDDL to the operating circuit 98, the operating circuit 98 is driven by using the local power supply voltage VDDL, and when the power gating circuit 99 does not apply the local power supply voltage VDDL to the operating circuit 98, the operating circuit 98 may not be driven.

In example embodiments, the operating circuit 98 connected to the local power supply voltage line 92 and the ground line 93 may include all circuits that are driven by using the local power supply voltage VDDL. In example embodiments, the operating circuit 98 may be used to perform operations based on a data signal.

The retention flip-flop 1 may be connected to the global power supply voltage line 91, the local power supply voltage line 92 and the ground line 93. The retention flip-flop 1 may serve to preserve the data when the power gating circuit 99 blocks the local power supply voltage VDDL.

Specifically, the retention flip-flop 1 may operate as a normal flip-flop while the power gating circuit 99 applies the local power supply voltage VDDL, and may serve to preserve the stored data when the power gating circuit 99 blocks the local power supply voltage VDDL.

The retention flip-flop 1 according to example embodiments may operate as a normal flip-flop by using the local power supply voltage VDDL and the global power supply voltage VDDG while the power gating circuit 99 applies the local power supply voltage VDDL, and may perform a retention operation by using the global power supply voltage VDDG while the power gating circuit 99 blocks the local power supply voltage VDDL. In the example embodiments, the data stored in the retention flip-flop 1 while the power gating circuit 99 blocks the local power supply voltage VDDL may be the data required for the operation of the operating circuit 98 when the power gating circuit 99 applies the local power supply voltage VDDL again.

The local power supply voltage line 92 and the global power supply voltage line 91 may be arranged separately as illustrated. The local power supply voltage VDDL may be provided to the local power supply voltage line 92 and the global power supply voltage VDDG may be provided to the global power supply voltage line 91.

The global power supply voltage line 91 may be relatively far away from the retention flip-flop 1 compared to the local power supply voltage line 92. Thus, in some cases, even if the magnitude of the global power supply voltage VDDG applied to the global power supply voltage line 91 is equal to the magnitude of the local power supply voltage VDDL applied to the local power supply voltage line 92, the magnitude of the voltage provided to the retention flip-flop 1 may be different. That is, the magnitude of the global power supply voltage VDDG measured by the retention flip-flop 1 may be smaller than the magnitude of the local power supply voltage VDDL.

In example embodiments, the semiconductor device may include, as illustrated, a plurality of local power supply voltage lines 92 and ground lines 93. In this case, the retention flip-flop 1 and the operating circuit 98 that are different from those of others may be connected to each of the local power supply voltage lines 92. Further, the power gating circuit 99 that determines the on/off of each of the local power supply voltage lines 92 may also be provided in plural as illustrated.

Figure 2:
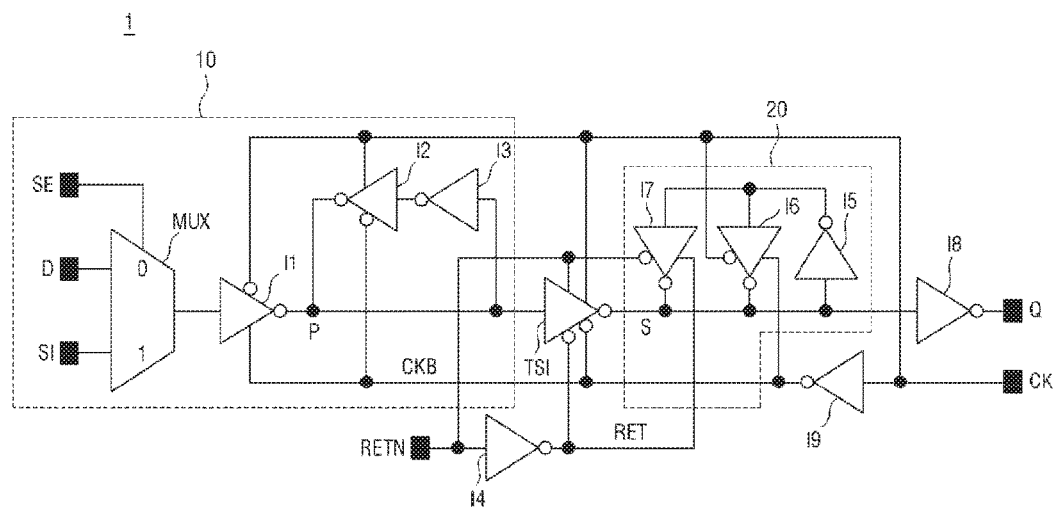
FIG. 2 is a circuit diagram of a retention flip-flop of FIG. 1.

FIG. 2 is a circuit diagram of the retention flip-flop of FIG. 1.

Referring to FIG. 2, the retention flip-flop 1 may include a first circuit 10, a second circuit 20, and a tri-state inverter TSI.

The first circuit 10 may include a multiplexer MUX and a plurality of inverters I1 to I3.

The multiplexer MUX may multiplex a data signal D and a scan input signal SI under the control of a scan enable signal SE.

The inverter I1 may be controlled by a clock signal CK and an inverted clock signal CKB to provide an output of the multiplexer MUX to a node P.

The inverter I2 and the inverter I3 may serve as a master latch to store the output of the multiplexer MUX. That is, the inverter I2 and the inverter I3 may serve as a master latch to store the applied data signal D or scan input signal SI. The inverter I2 may be controlled by the clock signal CK and the inverted clock signal CKB.

A detailed circuit configuration of the first circuit 10 according to an example embodiment of the present inventive concepts will be described later with reference to FIG. 3.

The inverter I4 may invert an inverted retention signal RETN to generate a retention signal RET. The retention signal RET may serve to control a retention operation of the second circuit 20 or the slave latch included in the second circuit 20.

The tri-state inverter TSI may be disposed between the first circuit 10 including a master latch and the second circuit 20 including a slave latch, and connected to the first circuit 10 and the second circuit 20.

The tri-state inverter TSI is controlled by the clock signal CK and the inverted clock signal CKB while the signal level of the retention signal RET is a first level (for example, logical low—hereinafter referred to as L), and may invert the voltage level of the node P and provide the inverted result to the node S. On the other hand, the tri-state inverter TSI may not invert the voltage level of the node P and may prevent the transmission of a signal between the first circuit 10 and the second circuit 20 via the node S while the signal level of the retention signal RET is a second level (for example, logical high—hereinafter referred to as H).

A detailed circuit configuration of the tri-state inverter TSI will be described later with reference to FIG. 4.

The second circuit 20 may include a plurality of inverters I5 to I7.

The plurality of inverters I5 to I7 may serve as a slave latch to store the signal of the node S. That is, the inverters I5 to I7 may serve as a slave latch to store the data signal D provided from the master latch.

The inverter I5 may invert the output of the node S and provide the inverted result to the inverter I6 and the inverter I7. The inverter I6 may be controlled by the clock signal CK and the inverted clock signal CKB to invert the output of the inverter I5 and provide the inverted result to the node S. The inverter I7 may be controlled by the retention signal RET and the inverted retention signal RETN to invert the output of the inverter I5 and provide the inverted result to the node S.

A detailed circuit configuration of the second circuit 20 will be described later with reference to FIG. 5.

The inverter I8 may output an output signal Q by inverting the output of the slave latch.

The inverter I9 may output the inverted clock signal CKB by inverting the clock signal CK.

Figure 3:
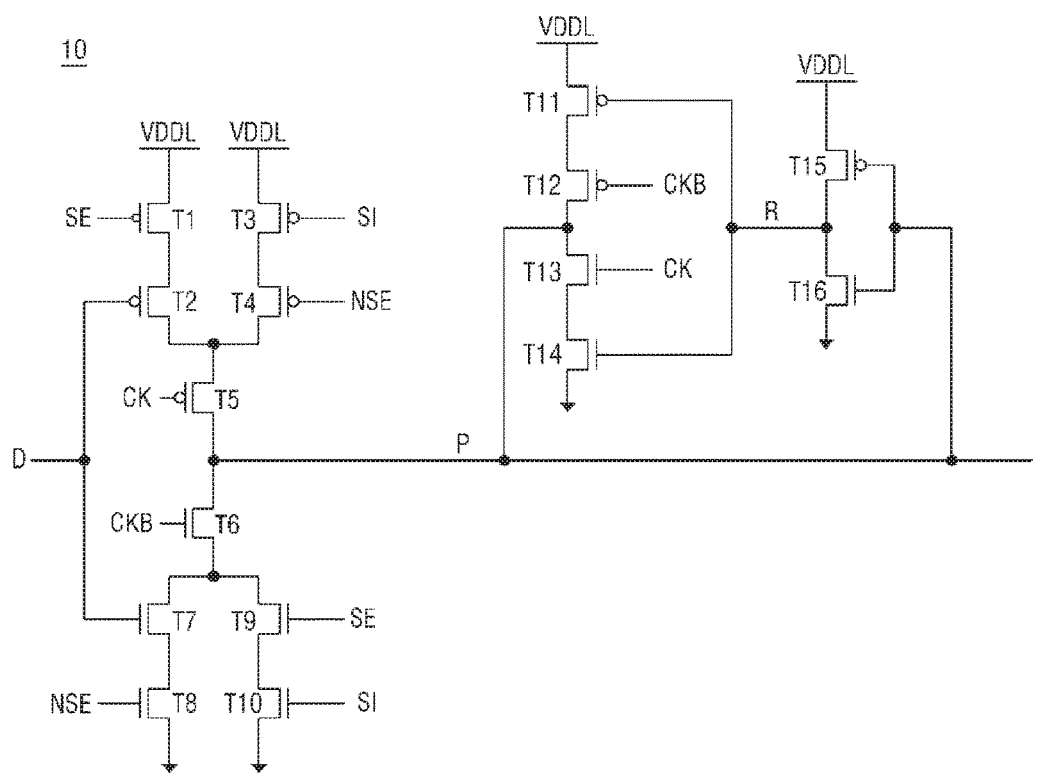
FIG. 3 illustrates a detailed circuit diagram of a first circuit of FIG. 2 according to example embodiments of the present inventive concepts.

FIG. 3 illustrates a detailed circuit diagram of the first circuit of FIG. 2 according to the example embodiments of the present inventive concepts.

Referring to FIG. 3, the first circuit 10 may include a plurality of transistors T1 to T16.

The transistors T1 to T5, T11, T12 and T15 may include, for example, p-type transistors, and the transistors T6 to T10, T13, T14 and T16 may include, for example, n-type transistors. However, example embodiments of the present inventive concepts are not limited thereto, and the conductivity type of the transistor may be modified if necessary.

The transistors T1 to T4 may provide the local power supply voltage VDDL to the transistor T5. Specifically, the transistor T1 may be gated by the scan enable signal SE, the transistor T2 may be gated by the data signal D, the transistor T3 may be gated by the scan input signal SI, and the transistor T4 may be gated by the inverted scan enable signal NSE, thereby providing the local power supply voltage VDDL to the transistor T5.

The transistors T7 to T10 may connect the transistor T6 to the ground voltage. Specifically, the transistor T7 may be gated by the data signal D, the transistor T8 may be gated by the inverted scan enable signal NSE, the transistor T9 may be gated by the scan enable signal SE, and the transistor T10 may be gated by the scan input signal SI, thereby connecting the transistor T6 to the ground voltage.

The transistor T5 may be gated by the clock signal CK, and the transistor T6 may be gated by the inverted clock signal CKB. The transistor T5 and the transistor T6 may be connected in series with each other, and the output of the transistor T5 and the transistor T6 may be provided to the node P.

The transistors T11 to T16 may serve as a master latch.

The transistors T15 and T16 may invert the data signal of the node P and output the inverted result to the node R.

Specifically, the transistor T15 may be gated by the data signal of the node P to provide the local power supply voltage VDDL to the node R. Then, the transistor T16 may be gated by the data signal of the node P to connect the node R to the ground voltage.

The transistors T11 and T14 may invert the data signal of the node R and output the inverted result to the node P under the control of the clock signal CK and the inverted clock signal CKB.

Specifically, the transistor T11 may be gated by the data signal of the node R, and the transistor T12 may be gated by the inverted clock signal CKB, thereby providing the local power supply voltage VDDL to the node P. Then, the transistor T13 may be gated by the clock signal CK, and the transistor T14 may be gated by the data signal of the node R, thereby connecting the node P to the ground voltage.

Figure 4:
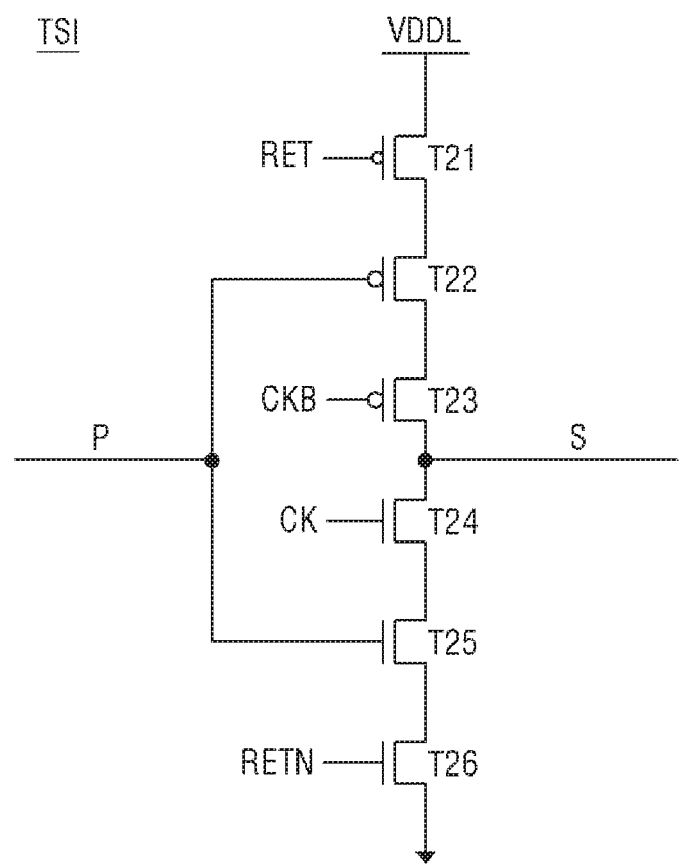
FIG. 4 illustrates a detailed circuit diagram of a tri-state inverter of FIG. 2 according to example embodiments of the present inventive concepts.

FIG. 4 illustrates a detailed circuit diagram of the tri-state inverter of FIG. 2 according to the example embodiments of the present inventive concepts.

Referring to FIG. 4, the tri-state inverter TSI may include a plurality of transistors T21 to T26.

The transistors 121 to T23 may include, for example, p-type transistors, and the transistors T24 to T26 may include, for example, n-type transistors. However, example embodiments the present inventive concepts are not limited thereto, and the conductivity type of the transistor may be modified if necessary.

The transistors T21 to 123 may provide the local power supply voltage VDDL to the node S. Specifically, the transistor T21 may be gated by the retention signal RET, the transistor T22 may be gated by the data signal D of the node P, and the transistor T23 may be gated by the inverted clock signal CKB, thereby providing the local power supply voltage VDDL to the node S.

The transistors 124 to 126 may connect the node S to the ground voltage. Specifically, the transistor T24 may be gated by the clock signal CK, the transistor T25 may be gated by the data signal D of the node P, and the transistor T26 may be gated by the inverted retention signal RETN, thereby connecting the node S to the ground voltage.

Figure 5:
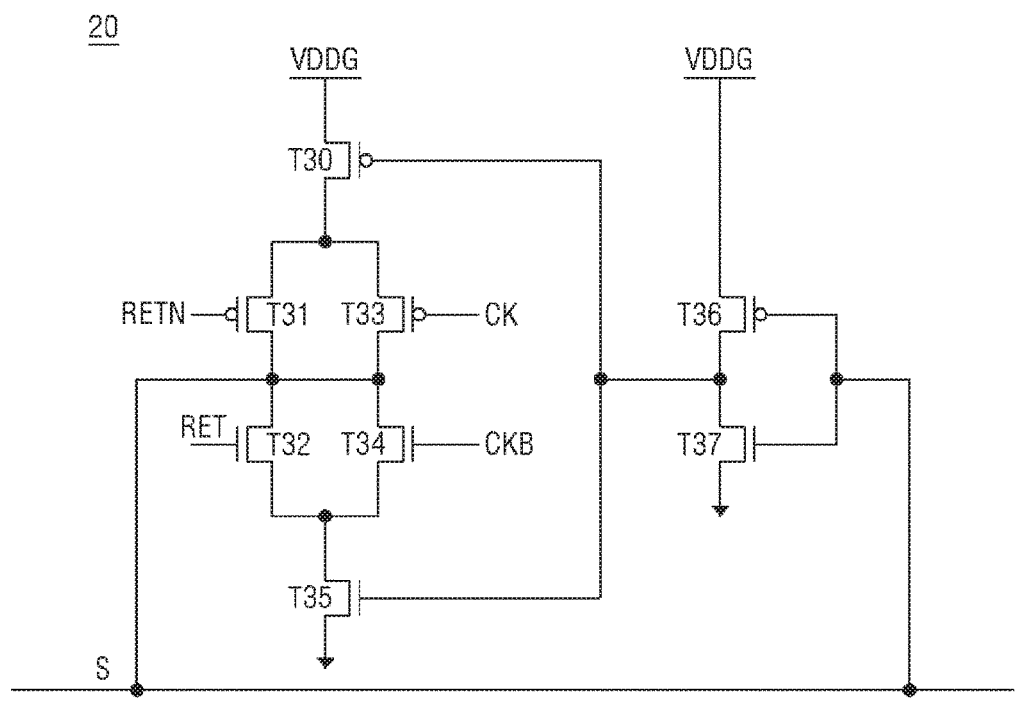
FIG. 5 illustrates a detailed circuit diagram of a second circuit of FIG. 2 according to example embodiments of the present inventive concepts.

FIG. 5 illustrates a detailed circuit diagram of the second circuit of FIG. 2 according to example embodiments of the present inventive concepts.

Referring to FIG. 5, the second circuit 20 may include a plurality of transistors T30 to T37.

The transistors T30, T31, T33 and T36 may include, for example, p-type transistors, and the transistors T32, T34, T35 and T37 may include, for example, n-type transistors. However, example embodiments of the present inventive concepts are not limited thereto, and the conductivity type of the transistor may be modified if necessary.

The transistor T30 may provide the global power supply voltage VDDG to the transistors T31 and T33. Specifically, the transistor T30 may be gated by the output of the inverter I5 (see FIG. 2) including the transistors T36 and 137 to provide the global power supply voltage VDDG to the transistors T31 and T33.

The transistor T35 may connect the transistors T31 and T33 to the ground voltage. Specifically, the transistor T35 may be gated by the output of the inverter I5 (see FIG. 2) including the transistors T36 and T37 to connect the transistors T31 and T33 to the ground voltage.

The transistor T33 and the transistor T34 may be connected in series to each other. The transistor T33 may be gated by the clock signal CK, and the transistor T34 may be gated by inverted clock signal CKB. The output of the transistor T33 and the transistor T34 may be provided to the node S.

The transistor T31 and the transistor T32 may be connected in series to each other. The transistor T31 may be gated by the inverted retention signal RETN, and the transistor T32 may be gated by the retention signal RET. The output of the transistor T31 and the transistor T32 may be provided to the node S.

The transistor T36 and the transistor T37 may output a gating signal of the transistor T30 and the transistor T35 by inverting the data signal of the node S.

The transistors T30 to T37 may serve as a slave latch.

Hereinafter, an operation of a retention flip-flop according to example embodiments of the present inventive concepts will be described with reference to FIGS. 6 to 10.

Figure 6:
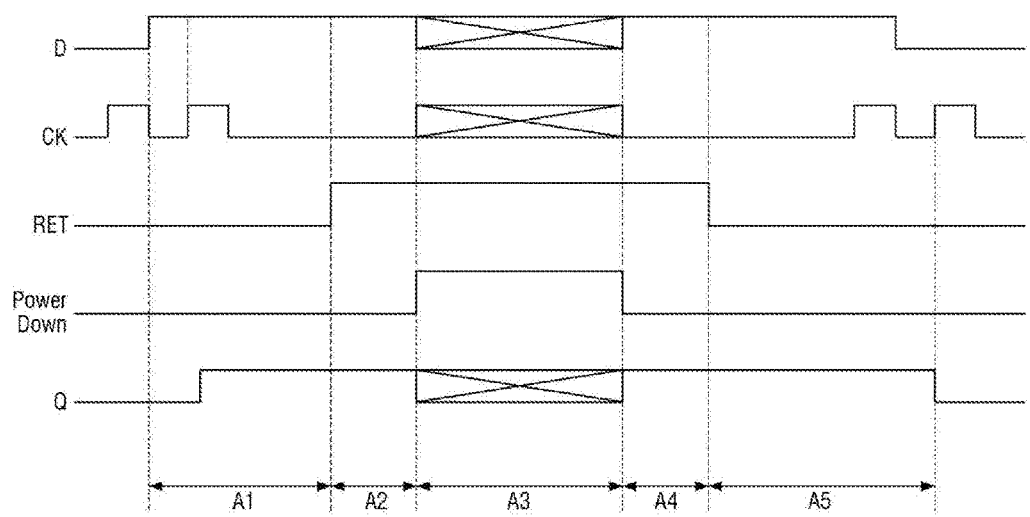
FIG. 6 is an operation timing diagram of a retention flip-flop of FIG. 2.

FIG. 6 is an operation timing diagram of the retention flip-flop of FIG. 2. FIGS. 7 to 10 are diagrams for explaining an operation of the retention flip-flop of FIG. 2.

First, referring to FIG. 6, in a section A1 in which the signal level of the retention signal RET is a first level L, the retention flip-flop 1 operates as a normal flip-flop.

Figure 7:
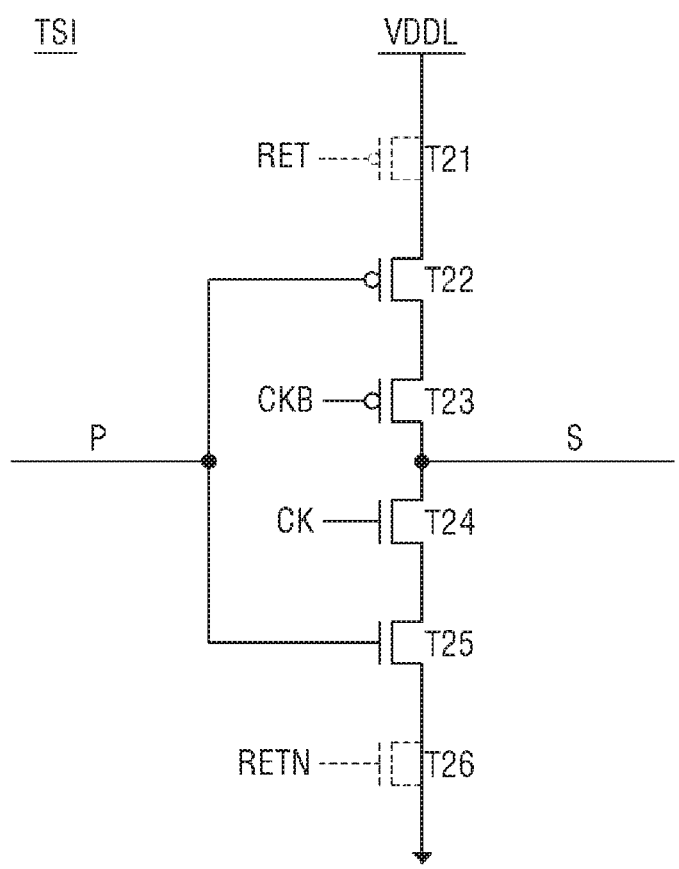
FIGS. 7 to 10 are diagrams for explaining an operation of the retention flip-flop of FIG. 2.

Specifically, referring to FIG. 7, since the signal level of the retention signal RET is the first level L, the transistors T21 and T26 included in the tri-state inverter TSI are turned on. Accordingly, the transistor T21 connects the transistors T22 to the local power supply voltage VDDL, and the transistor T26 connects the transistors T25 to the ground voltage.

Figure 8:
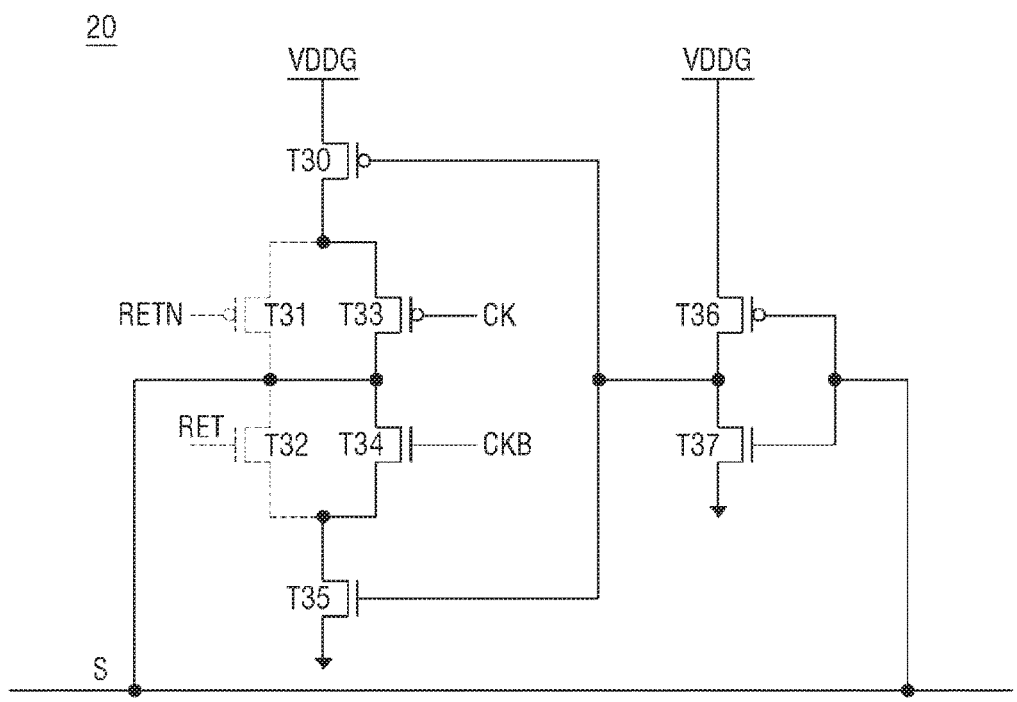

Next, referring to FIG. 8, since the signal level of the retention signal RET is the first level L, the transistors T31 and T32 are turned off. Accordingly, only the transistors T33 and T34 are controlled in accordance with the signal level of the clock signal CK to transmit a data signal to the node S.

That is, the first circuit 10, the tri-state inverter TSI and the second circuit 20 are controlled in accordance with the signal level of the clock signal CK to latch the input data signal D and transmit it as an output signal Q. Accordingly, the retention flip-flop 1 operates as a normal flip-flop.

Then, referring to FIG. 6, the signal level of the clock signal CK is maintained at the first level L before the signal level of the retention signal RET is changed to a second level H.

Then, referring to FIG. 6, in a section A2 in which the signal level of the retention signal RET is changed to the second level H, the retention flip-flop 1 performs a retention operation by using the global power supply voltage VDDG.

Figure 9:
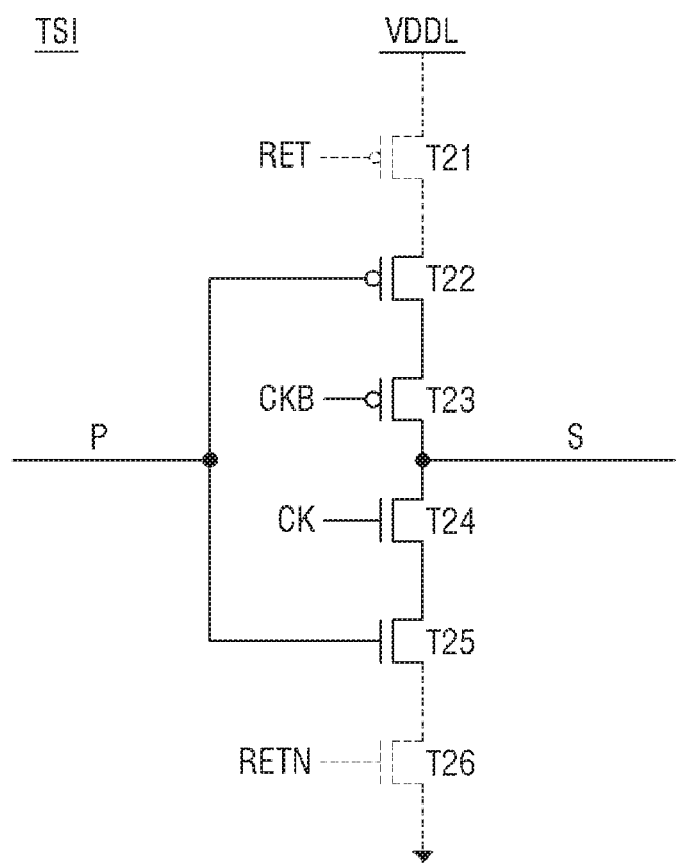

Specifically, referring to FIG. 9, when the signal level of the retention signal RET is changed to the second level H, the transistors T21 and T26 included in the tri-state inverter TSI are turned off. Accordingly, the transistor T21 blocks the local power supply voltage VDDL to the transistor T22, and the transistor T26 does not connect the transistor T25 to the ground voltage. Accordingly, the data signal of the node P is not transmitted to the node S.

Figure 10:
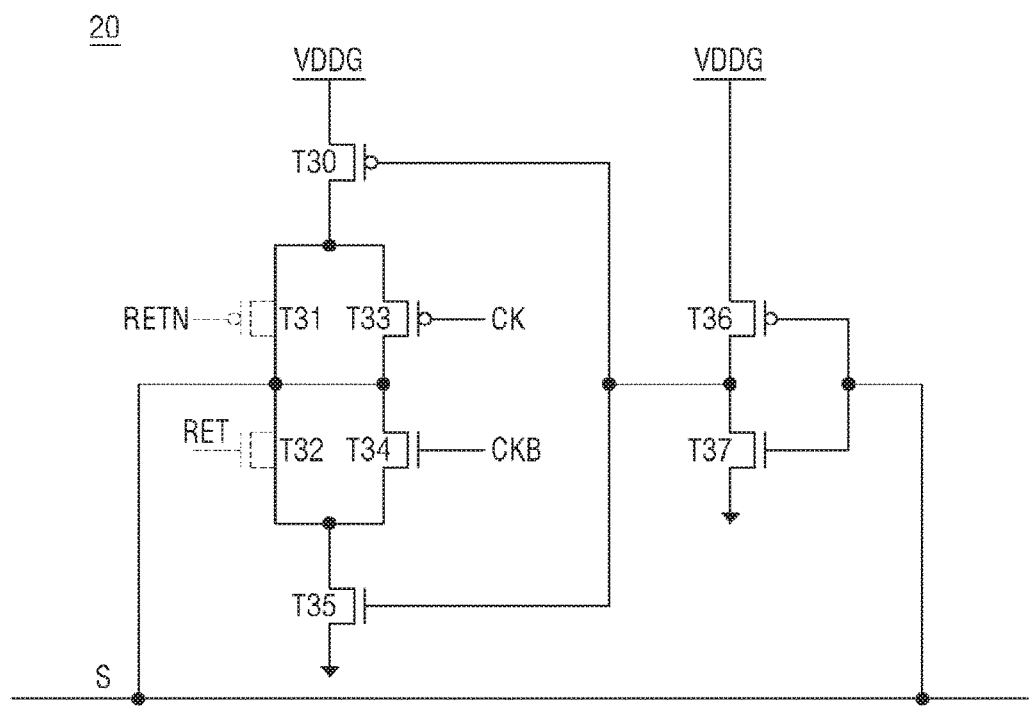

Then, referring to FIG. 10, when the signal level of the retention signal RET is changed to the second level H, the transistors T31 and T32 are turned on. Thus, a data path is formed regardless of the clock signal CK provided to the transistors T33 and T34, so that the data signal can be transmitted to the node S.

That is, the tri-state inverter TSI no longer transmits an output of the first circuit 10 to the second circuit 20, and the second circuit 20 latches the data signal of the node S by using the global power supply voltage VDDG without the supply of the local power supply voltage VDDL regardless of the signal level of the clock signal CK. Thus, the retention flip-flop 1 performs a retention operation.

Referring again to FIG. 6, for example, in a section A3 in which the local power supply voltage VDDL is blocked to the retention flip-flop 1 by the power gating circuit 99 (see FIG. 1), for example, during a power down period, and a section A4 in which the local power supply voltage VDDL is provided again to the retention flip-flop 1, the retention flip-flop 1 continuously performs a retention operation by using the global power supply voltage VDDG.

Thereafter, in a section A5 in which the signal level of the retention signal RET is changed to the first level L, the retention flip-flop 1 operates as a normal flip-flop again. Since this operation has been described in detail above, a redundant description will be omitted.

In one or more example embodiments, the retention flip-flop 1 may avoid an unnecessary transition from occurring by the clock signal CK after the retention signal RET is changed to the second level H. Thus, the operating power may be reduced.

In addition, since the retention flip-flop 1 according to example embodiments may perform the retention operation by connecting the tri-state inverter TSI, which is controlled by the retention signal RET between the master latch and the slave latch, the number of elements required for the retention operation may be reduced (or, alternatively minimized). Accordingly, it is possible to reduce the operation leakage current and achieve miniaturization of the semiconductor device.

Figure 11:
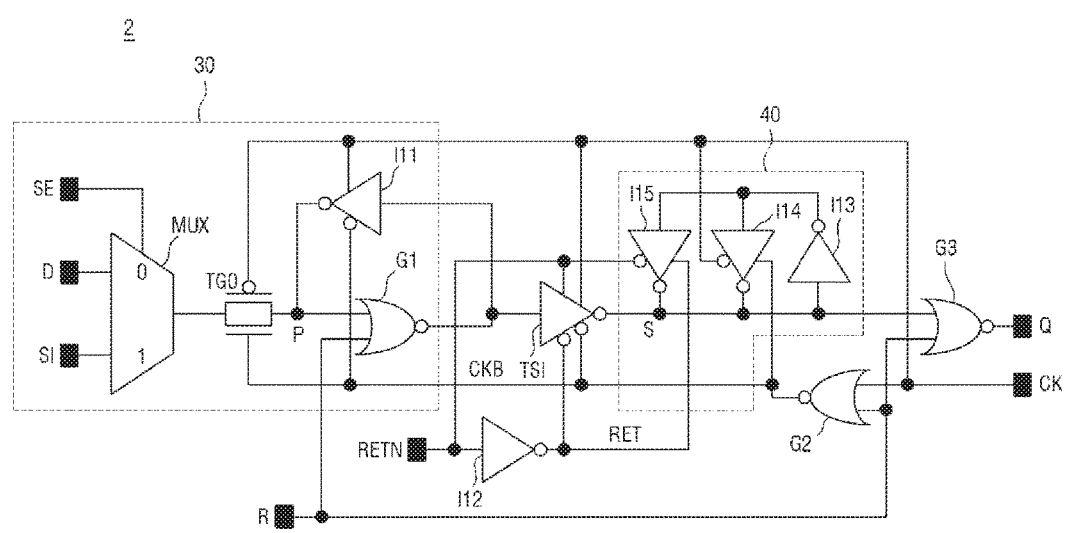
FIG. 11 is a circuit diagram of a retention flip-flop according to some other example embodiments of the present inventive concepts.

FIG. 11 is a circuit diagram of a retention flip-flop according to some other example embodiments of the present inventive concepts. The following description will mainly focus on differences from the above-described example embodiment and a redundant description will be omitted.

Referring to FIG. 11, a retention flip-flop 2 may include a first circuit 30, the second circuit 20 and the tri-state inverter TSI.

The first circuit 30 may include a multiplexer MUX, a transfer gate TG0, a gate G1, and an inverter I11.

The multiplexer MUX may multiplex the data signal D and the scan input signal SI under the control of the scan enable signal SE.

The transfer gate TG0 may be controlled by the output of the inverter I11 and the output of the gate G2 to transmit the output (D or SI) of the multiplexer MUX to node P.

The gate G1 may perform an NOR operation on a reset signal R and the output of the transfer gate TG0 to provide the operation result to the inverter I11 and the tri-state inverter TSI.

The inverter I11 may be controlled by the clock signal CK and the output of a gate G2 to invert the output of the gate G1 and provide the inverted result to the node P.

In example embodiments, if the signal level of the reset signal R is the first level L, the gate G1 operates as an inverter that inverts the input (D or SI) and outputs the inverted result. Thus, the gate G1 and the inverter I11 may serve as a master latch to store the output of the multiplexer MUX. That is, the gate G1 and the inverter I11 may serve as a master latch to store the applied data signal D or scan input signal SI.

On the other hand, if the signal level of the reset signal R is the second level H, the signal level of the output signal of the gate G1 becomes the first level L. Thus, the data signal stored in the master latch may be reset according to the signal level of the reset signal R.

An inverter I12 may invert the retention signal RET. The retention signal RET may serve to control a retention operation of a second circuit 40 or a slave latch included in the second circuit 40.

The tri-state inverter TSI may be disposed between the first circuit 30 including a master latch and the second circuit 40 including a slave latch and connected between the first circuit 30 and the second circuit 40. Since the tri-state inverter TSI has been described in detail above, a redundant description will be omitted.

The second circuit 40 may include a plurality of inverters I13 to I15.

The inverters I13 to I15 may serve as a slave latch to store the signal of the node S. That is, the inverters I13 to I15 may serve as a slave latch to store the data signal D provided from the master latch.

The inverter I13 may invert the output of the node S and provide the inverted result to the inverter I14 and the inverter I15. The inverter I14 may be controlled by the output of the gate G2 and the clock signal CK to invert the output of the inverter I13 and provide the inverted result to the node S. The inverter I15 may be controlled by the retention signal RET and the inverted retention signal RETN to invert the output of the inverter I13 and provide the inverted result to the node S.

The gate G2 may perform an NOR operation on the signal level of the reset signal and the clock signal CK and output the operation result. A gate G3 may perform an NOR operation on the signal level of the reset signal R and the node S and output the operation result as an output signal Q.

In example embodiments, if the signal level of the reset signal R is the first level L, the gates G1 to G3 operates as an inverter that inverts the input and outputs the inverted result. Thus, the retention flip-flop 2 according to the present example embodiments has the same configuration as the retention flip-flop 1 and operates in the same manner as the retention flip-flop 1.

On the other hand, if the signal level of the reset signal R is the second level H, the signal level of the output signal of the gates G1 to G3 becomes the first level L. Thus, a reset operation is performed such that the signal level of the output signal Q of the retention flip-flop 2 becomes the first level L. Specifically, since the gate G1 always outputs a signal of the first level L regardless of the signal level of the node P, the master latch may be reset. Further, since the gate G3 always outputs a signal of the first level L regardless of the signal level of the node P, the output signal Q may always become the first level L regardless of the signal level of the retention signal RET or REIN.

While example embodiments of inventive concepts have been particularly shown and described with reference to some example embodiments thereof, it will be understood by those of ordinary skill in the art that various changes in form and details may be made therein without departing from the spirit and scope of the example embodiments of the inventive concepts as defined by the following claims. It is therefore desired that the example embodiments be considered in all respects as illustrative and not restrictive, reference being made to the appended claims rather than the foregoing description to indicate the scope of the example embodiments of the inventive concepts.

What is claimed is:

1. A semiconductor device configured to receive at least a global power supply voltage via a first line, and a local power supply voltage via a second line, the semiconductor device comprising:
    a first operating circuit configured to selectively receive the local power supply voltage via the second line, and to operate based on the local power supply voltage;
    a first power gating circuit configured to selectively supply the local power supply voltage to the first operating circuit via the second line; and
    a first retention flip-flop connected to the first line and the second line, the first retention flip-flop configured to perform a retention operation, the first retention flip-flop including,
        a first circuit including a master latch,
        a second circuit including a slave latch, the slave latch configured to selectively provide data associated with a prior iteration of the retention operation to the first operating circuit, and
        a first tri-state inverter connected between the master latch and the slave latch.

2. The semiconductor device of claim 1, wherein
the first circuit and the first tri-state inverter are connected to the second line and not connected to the first line, and
the second circuit is connected to the first line and not connected to the second line.

3. The semiconductor device of claim 1, wherein the first tri-state inverter comprises:
a first transistor having a gate configured to receive a retention signal, the slave latch configured to perform the retention operation by selectively supplying the local power supply voltage to the first tri-state inverter.

4. The semiconductor device of claim 3, wherein the first tri-state inverter further comprises:
a second transistor connected in series to the first transistor and having a gate configured to receive a clock signal, the second transistor configured to selectively invert an output of the master latch to generate an inverted signal and transmit the inverted signal to the slave latch based on the clock signal, the inverted signal being the signal provided from the master latch.

5. The semiconductor device of claim 1, wherein the first tri-state inverter comprises:
a first transistor, a second transistor and a third transistor connected in series between the second line and an input terminal of the slave latch, wherein
the first transistor includes a gate configured to receive a retention signal controlling the retention operation of the slave latch,
the second transistor includes a gate configured to receive an output signal of the master latch, and
the third transistor includes a gate configured to receive a clock signal.

6. The semiconductor device of claim 1, wherein the second circuit comprises:
a first inverter configured to selectively invert a slave latch signal based on a clock signal, and
a second inverter configured to selectively invert the slave latch signal based on a retention signal, the slave latch configured to selectively perform the retention operation based on the retention signal.

7. The semiconductor device of claim 6, wherein the first tri-state inverter is controlled by the retention signal.

8. The semiconductor device of claim 1, wherein the first circuit includes a first NOR gate configured to perform a NOR operation on a reset signal and a data signal.

9. The semiconductor device of claim 8, further comprising:
a second NOR gate configured to perform a NOR operation on a clock signal and the reset signal; and
a third NOR gate configured to perform a NOR operation on the reset signal and a retention signal, the slave latch configured to selectively perform the retention operation based on the retention signal.

10. The semiconductor device of claim 1, further comprising:
a second operating circuit configured to selectively receive the local power supply voltage via a third line, and to operate based on the local power supply voltage, the third line being a separate line from the second line and connected to the local power supply voltage;
a second power gating circuit configured to selectively supply the local power supply voltage to the second operating circuit via the third line; and
a second retention flip-flop connected to the first line and the third line, the second retention flip-flop including,
a third circuit including a second master latch,
a fourth circuit including a second slave latch, and
a second tri-state inverter connected between the second master latch and the second slave latch.

11. A semiconductor device configured to receive at least a global power supply voltage via a first line, and selectively receive a local power supply voltage from a power gating circuit connected to a second line, the semiconductor device comprising:
a first circuit connected to the second line, the first circuit configured to receive a data signal, and to store the data signal based on a clock signal and the local power supply voltage;
a second circuit configured to,
receive a retention signal,
store the data signal based on the global power supply voltage and the clock signal, if a signal level of the retention signal is a first level,
store the data signal by performing a retention operation using the global power supply voltage irrespective of the clock signal, if the signal level of the retention signal is a second level, the second level being different from the first level, and
selectively provide the data signal associated with a prior iteration of the retention operation to an operating circuit; and
a tri-state inverter configured to selectively invert an output of the first circuit to generate an inverted signal based on the signal level of the retention signal and transmit the inverted signal to the second circuit.

12. The semiconductor device of claim 11, wherein the tri-state inverter is configured to,
invert the output of the first circuit and transmit the inverted signal to the second circuit based on the local power supply voltage and the clock signal, if the signal level of the retention signal is the first level, and
block transmission of the output of the first circuit to the second circuit, if the signal level of the retention signal is the second level.

13. The semiconductor device of claim 11, wherein the second circuit comprises:
a first inverter configured to invert a slave latch signal based on the clock signal, and
a second inverter configured to invert the slave latch signal based on the retention signal, the second circuit configured to selectively perform the retention operation based on the retention signal.

14. The semiconductor device of claim 13, wherein the first inverter is configured to invert the slave latch signal based on the clock signal, and a signal obtained by performing an NOR operation on the clock signal and a reset signal.

15. The semiconductor device of claim 11, wherein the tri-state inverter is configured to maintain the signal level of the clock signal at the first level before the signal level of the retention signal is changed from the first level to the second level.

16. A semiconductor device comprising:
a power gating circuit configured to selectively supply a local power supply voltage to an operating circuit; and
a retention reset flip-flop configured to receive a retention signal and data, to latch the data based on at least the local power supply voltage and a clock signal, if the retention signal has a first level, and to preserve the data during a retention operation using a global power supply voltage irrespective of the clock signal, if the retention signal has a second level, the retention reset flip-flop including a master latch, a slave latch, and a tri-state inverter connected therebetween, the master latch configured to operate using the local power supply voltage, the slave latch configured to operate using the global power supply voltage to selectively provide the data associated with a prior iteration of the retention operation to the operating circuit, and the tri-state inverter configured to selectively transmit an inverted signal from the master latch to the slave latch based on the retention signal.

17. The semiconductor device of claim 16, wherein the semiconductor device is configured to receive the global power supply voltage via a first line, and to receive the local power supply voltage via a second line, the first and the second line being connected to different voltage supplies.

18. The semiconductor device of claim 16, wherein the tri-state inverter is configured to,
provide the inverted signal from the master latch to the slave latch based on the clock signal, if the retention signal has the first level, and
block transmission of the inverted signal to the slave latch, if the retention signal has the second level.

19. The semiconductor device of claim 18, wherein the slave latch is configured to preserve the data by latching the data using the global power supply voltage when the tri-state inverter blocks the transmission of the inverted signal to the slave latch.

20. The semiconductor device of claim 19, wherein the tri-state inverter is configured to block the transmission of the inverted signal to the slave latch before a signal level of the retention signal changes from the first level to the second level such that the retention reset flip-flop does not transition when the retention signal subsequently changes to the second level.

* * * * *